(12) United States Patent
Hammerschmidt et al.

(10) Patent No.: US 7,791,405 B2
(45) Date of Patent: Sep. 7, 2010

(54) METHOD FOR CONTROLLING AN OUTPUT VOLTAGE AND VOLTAGE CONTROLLER

(75) Inventors: Dirk Hammerschmidt, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 58 days.

(21) Appl. No.: 12/128,087

(22) Filed: May 28, 2008

(65) Prior Publication Data
US 2008/0297235 A1 Dec. 4, 2008

(30) Foreign Application Priority Data
May 31, 2007 (DE) .................. 10 2007 025 323

(51) Int. Cl.
*G05F 1/10* (2006.01)
(52) U.S. Cl. .................................... 327/540
(58) Field of Classification Search .......... 327/536, 327/540, 541
See application file for complete search history.

(56) References Cited

U.S. PATENT DOCUMENTS

| | | | | |
|---|---|---|---|---|
| 5,648,718 | A * | 7/1997 | Edwards | 323/274 |
| 5,852,359 | A * | 12/1998 | Callahan et al. | 323/274 |
| 6,040,736 | A | 3/2000 | Milanesi et al. | |
| 6,049,201 | A | 4/2000 | Feldtkeller | |
| 6,184,746 | B1 * | 2/2001 | Crowley | 327/551 |
| 6,188,212 | B1 | 2/2001 | Larson et al. | |
| 6,281,667 | B1 * | 8/2001 | Matsumura | 323/274 |
| 6,417,725 | B1 * | 7/2002 | Aram et al. | 327/541 |
| 6,504,416 | B1 * | 1/2003 | Mariani | 327/308 |
| 6,617,931 | B2 * | 9/2003 | Theus et al. | 330/310 |
| 7,190,211 | B2 * | 3/2007 | Nakagawa et al. | 327/536 |
| 2002/0003451 | A1 | 1/2002 | Theus et al. | |

FOREIGN PATENT DOCUMENTS

| | | |
|---|---|---|
| DE | 198 18 465 A1 | 10/1999 |
| DE | 100 23 524 A1 | 11/2001 |
| DE | 697 35 572 T2 | 3/2006 |
| EP | 0 818 875 B1 | 3/2006 |

OTHER PUBLICATIONS

Srinivasan, Venkatesh; "A Precision CMOS Amplifier Using Floating-Gate Transistors for Offset Cancellation"; IEEE Journal of Solid-State Circuits, vol. 42, No. 2, Feb. 2007, pp. 280-291.
Carley, L. Richard; "Trimming Analog Circuits Using Floating-Gate Analog MOS Memory"; IEEE Journal of Solid-State Circuits, vol. 24, No. 6, Dec. 1989, pp. 1569-1575.

* cited by examiner

*Primary Examiner*—Jeffrey S Zweizig
(74) *Attorney, Agent, or Firm*—Dickstein, Shapiro, LLP.

(57) ABSTRACT

A voltage controller for controlling an output voltage to a predetermined value. The voltage controller has a first terminal configured to connect a supply voltage, a second terminal configured to output the output voltage, a control voltage generating unit configured to provide a control voltage, and a control transistor. The control transistor is connected as a series controller between the first terminal and the second terminal. The control voltage can be applied to the control terminal of the control transistor, wherein the output voltage is controlled in a manner dependent on the supply voltage and the control voltage. Furthermore, an offset voltage is superposed on the control voltage.

19 Claims, 3 Drawing Sheets

METHOD FOR CONTROLLING AN OUTPUT VOLTAGE AND VOLTAGE CONTROLLER

CROSS-REFERENCE TO RELATED APPLICATION

This application claims priority to German Patent Application Serial No. 10 2007 025 323.2, which was filed May 31, 2007, and is incorporated herein by reference in its entirety.

TECHNICAL FIELD

The present application generally relates to voltage controller devices for providing a controllable output voltage which is obtained from a power supply voltage of a higher potential than the output voltage and which is controlled in a manner dependent on a predetermined reference voltage. In particular, the present application relates to a voltage controller in which a small voltage drop is provided between the supply voltage and the output voltage.

Specifically, the present application relates to a voltage controller for controlling an output voltage to a predetermined value, wherein the voltage controller has a second terminal for outputting the output voltage and a first terminal for connecting a supply voltage of the voltage controller.

BACKGROUND

Various methods for controlling an output voltage in a manner dependent on a supply voltage and a reference voltage exist. One known control device is based, for example, on the lateral PNP controller for the vertical PNP controller. However, circuit arrangements of this type have the disadvantage that a large chip area is taken up and that interference suppression with respect to interference of the supply voltage source is reduced. Furthermore, the lateral PNP controller has poor load correction since indirect driving via the current mirror or other loop arrangements is necessary. Moreover, the vertical PNP controller requires additional mask steps during production, whereby the entire circuit arrangement becomes more complex and hence more expensive in terms of production.

SUMMARY

The present application provides an improved voltage controller.

A concept of the application consists in providing a relatively high control potential for a series controller of a voltage controller, said series controller being formed as a control transistor. In particular, the voltage controller according to the application has an offset voltage device for generating an offset voltage, which is added to a control voltage.

The voltage controller according to the application for controlling an output voltage to a predetermined value includes:
  a) a first terminal configured to connect a supply voltage;
  b) a second terminal configured to output the output voltage of the voltage controller;
  c) a control voltage generating unit configured to provide a control voltage;
  d) a control transistor, which is connected as a series controller between the first terminal and the second terminal and to the control terminal to which the control voltage can be applied; and
  e) an offset voltage holding device configured to hold an offset voltage, which is superposed on the control voltage, wherein the offset voltage holding device can optionally be connected to an offset voltage generating device.

Furthermore, the method according to the application for controlling an output voltage to a predetermined value includes:
  f) providing a first terminal for connecting a supply voltage;
  g) providing a second terminal for outputting the output voltage;
  h) generating a control voltage by means of a control voltage unit; and
  i) applying the reference voltage to a control terminal of a control transistor connected as a series controller between the first terminal and the second terminal, wherein an offset voltage is held by means of an offset voltage holding device arranged in the voltage controller, said offset voltage being superposed on the control voltage, and the offset voltage holding device can optionally be connected to an offset voltage generating device.

BRIEF DESCRIPTION OF THE DRAWINGS

Exemplary embodiments of the application are illustrated in the drawings and are explained in more detail in the description below.

In the drawings.

In the figures, identical reference symbols designate identical or functionally identical components or steps.

DESCRIPTION

Figure 1:
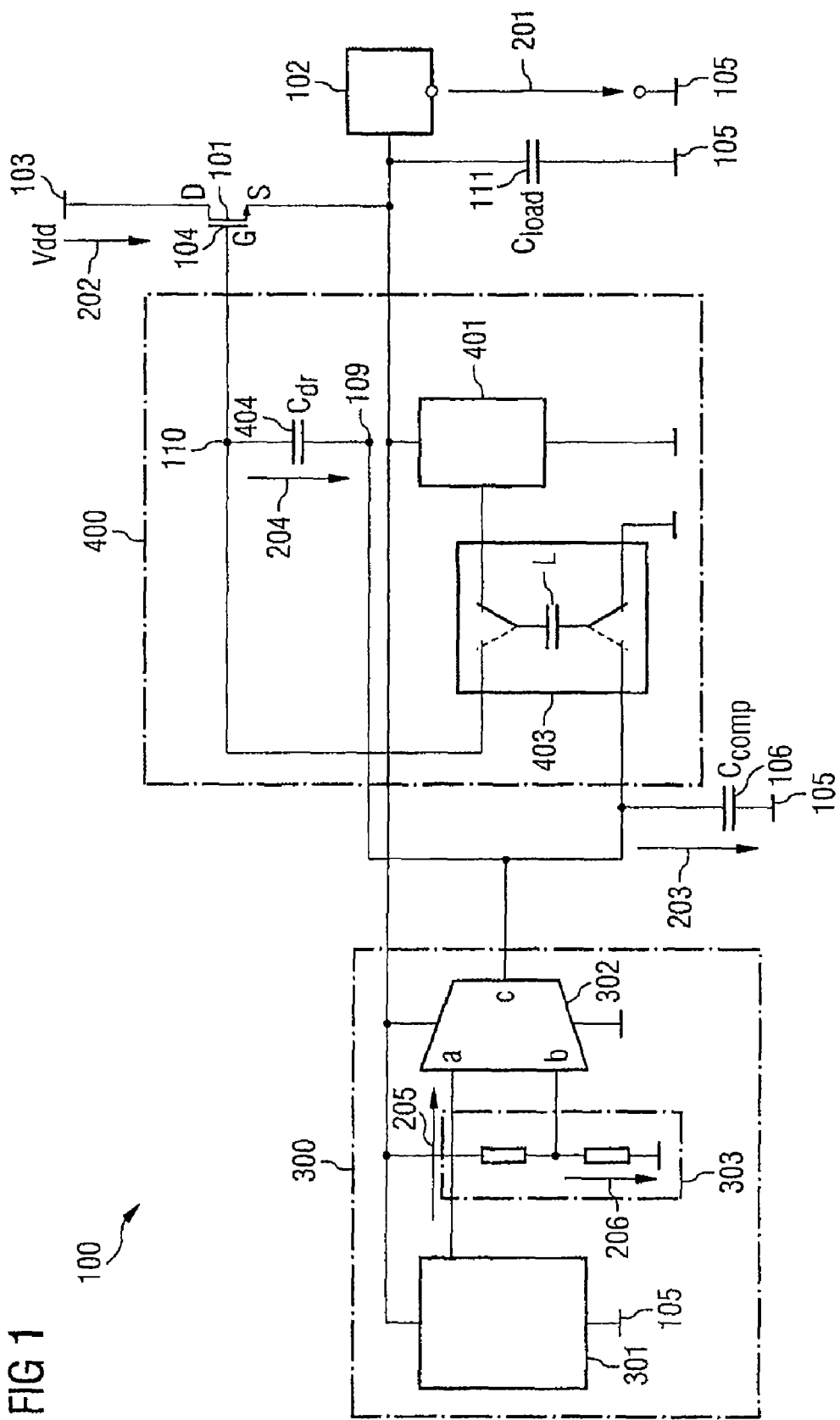
FIG. 1 shows a schematic block diagram of a voltage controller with biasing capacitance and charge pump in accordance with one preferred exemplary embodiment of the present application.

As already explained, the voltage controller according to the application for controlling an output voltage to a predetermined value includes:
  j) a first terminal configured to connect a supply voltage;
  k) a second terminal configured to output the output voltage of the voltage controller;
  l) a control voltage generating unit configured to provide a control voltage;
  m) a control transistor, which is connected as a series controller between the first terminal and the second terminal and to the control terminal to which the control voltage can be applied; and
  n) an offset voltage holding device configured to hold an offset voltage, which is superposed on the control voltage, wherein the offset voltage holding device can optionally be connected to an offset voltage generating device.

In an advantageous manner, the properties of a controller of the depletion nMOS type are maintained by retaining the source follower operation and good operating voltage suppression and good load correction are obtained. The required supply voltage for the control terminal (the gate) of the control transistor (series controller) is not achieved by means of a negative threshold voltage, however, but rather is achieved by means of a fixed voltage, which is preferably present at a biasing capacitor. A biasing capacitance of this type advantageously serves only for generating a fixed bias voltage, which can be refreshed again by a constant-voltage generating device with the aid of a small switched capacitance. In this way there is the advantage that only extremely small leakage currents have to be compensated for. Consequently, a device for generating an offset voltage is not necessarily part of the voltage controller according to the application.

A further advantage of the voltage controller method according to the application is that a high control speed is achieved because a biasing capacitance (biasing capacitor) of this type connects the output of a control voltage generating unit directly to the control terminal (gate) of the control transistor. Since a biasing capacitance of this type has to be refreshed again only very infrequently with small currents, the interference as a result of such refresh processes is negligible.

The voltage controller preferably has an offset voltage device for generating an offset voltage, which is superposed on the control voltage.

The offset voltage holding device expediently comprises a biasing capacitor for providing the offset voltage, preferably as a potential difference between terminal elements of the biasing capacitor.

Furthermore, it is preferred if a charge pump for providing the electrical charge for charging the biasing capacitor and a switching unit for switching the electrical charge provided by the charge pump onto the biasing capacitor are provided.

In accordance with one preferred development of the present application, the control terminal of the series controller has a larger voltage potential with respect to a ground terminal than corresponds to the value of the output voltage. In an advantageous manner, it is thus possible to apply a higher voltage than the output voltage with respect to the ground to the control terminal or the gate of the control transistor.

In accordance with a further preferred development of the present application, the control voltage generating unit for providing a control voltage has a reference voltage source for providing a reference voltage signal, a voltage divider unit for dividing the output voltage into a measurement voltage signal, and an amplifying unit for the potential comparison of the measurement voltage signal with the reference voltage signal and for outputting the control voltage.

The amplifying unit is expediently formed as a transconductance amplifier.

In accordance with yet another preferred development of the present application, the offset voltage device furthermore comprises a discharge detection unit for detecting a discharge state of the biasing capacitor and for driving the switching unit in accordance with the detected discharge state. In this way, a refresh cycle for the biasing capacitor can advantageously be adapted in a manner dependent on the discharge state of the biasing capacitor.

In accordance with yet another preferred development of the present application, the offset voltage device comprises a tunnel oxide transistor, via which the electrical charge provided by the charge pump is optionally transferred to the biasing capacitor.

In this way, the control terminal of the control transistor formed as a series controller represents a "floating gate". This leads to the additional advantage that a refresh repetition rate for the biasing capacitor can be reduced.

In accordance with yet another preferred development of the present application, the control transistor is formed as a field effect transistor in source follower connection.

A voltage supply for the offset voltage generating device, which preferably generates a predetermined, constant voltage, is preferably provided by the output voltage. The output voltage is advantageously controlled by the voltage controller itself.

In accordance with yet another preferred development of the present application, the offset voltage device has a filter device for filtering out switching spikes that can occur during a refresh of the biasing capacitor. In an advantageous manner, a stability of the entire voltage controller is not influenced given a suitable dimensioning of the refresh repetition rate, of the filter frequency and of the control speed.

Consequently, there is the advantage that a voltage controller is provided which can provide a low output voltage in conjunction with a small voltage drop between a supply voltage and the output voltage, which can be produced in a technologically simple manner and which can be designed to be robust relative to interference of the supply voltage source.

FIG. 1 shows a block diagram of a circuit arrangement of one preferred exemplary embodiment of the present application. An element of a voltage controller 100 shown in FIG. 1 is constituted by a control transistor 101, which is connected as a series controller between a first terminal 103 and a second terminal 102. In this case, the source terminal of the control transistor 101 is connected to the second terminal 102, while the drain terminal D of the control transistor 101 is connected to the first terminal 103.

It should be pointed out that all the voltage potentials in the exemplary embodiment shown in FIG. 1 are in relation to a ground terminal 105, but the application is not restricted to providing a single fixed ground potential 105. Consequently, a supply voltage 202, Vdd with respect to ground 105 is present at the first terminal 103, while the controlled output voltage is provided by an output voltage 201 between the second terminal 102 and the ground terminal 105. A load capacitance, which is determined by the connected load, is indicated by a reference symbol 111 and is connected between the second terminal 102 and the ground terminal 105.

The application involves providing control of the output voltage 201 by means of the control transistor 101, wherein a voltage difference between the supply voltage 202 and the output voltage 201 is intended to be small. The consequence of this is that a voltage drop across the control transistor 101 must be kept small. Consequently, it is necessary for a voltage potential at a control terminal 104 (gate terminal) of the control transistor to have a high value with respect to the ground terminal 105.

In particular, it is necessary that the control voltage potential present at the control terminal 104 with respect to the ground terminal 105 can have a higher value than the output voltage 201 present at the second terminal 102 with respect to the ground terminal 105. Furthermore, it is necessary for the control terminal 104 of the control transistor 101 to be supplied with voltage potentials which are derived from the controlled output voltage 201, since derivation from the uncontrolled supply voltage 202 would lead to interference that could not be afforded tolerance.

As will be described in detail below, all further circuit components of the voltage controller 100 are supplied with the controlled output voltage 201. Consequently, it is not possible for the remaining circuit components of the voltage controller 100 to provide an output voltage for driving the control terminal 104 of the control transistor 101 which in principle lies above the output voltage 201.

The basic concept of the present application consists, then, in providing an offset voltage holding device 404, which makes it possible to superpose an offset voltage 204 and to raise the voltage potential at the control terminal 104 of the control transistor 101 by precisely said offset voltage 204.

The further circuit components of the voltage controller 100 as shown in FIG. 1 will be described first of all. In order to provide a control voltage 203, the voltage controller 100 shown in FIG. 1 furthermore has a control voltage generating unit 300. The control voltage 203 generated by the control voltage generating unit 300 is used for controlling the control transistor 101 and thus for controlling the output voltage 201 present at the second terminal 102 with respect to the ground terminal 105.

Consequently, the control voltage 203 can be applied to the control terminal 104 of the control transistor 101 in such a way that control of the output voltage 201 in a manner dependent on the supply voltage 202, Vdd and the control voltage 203 can be provided. In an advantageous manner, it is furthermore possible that the offset voltage 204 generated by the offset voltage device 400 can be superposed on the control voltage 203.

The control voltage generating unit 300 is supplied with the output voltage 201 with respect to the ground terminal 105 and thus works with a stabilized supply voltage. The control voltage generating unit 300 furthermore has a reference voltage source 301 for generating a reference voltage signal 205. The reference voltage source 301 is a voltage source which is designed for a specific application and generates a specific reference voltage signal 205, which is predetermined by the application of the voltage controller 100. Said reference voltage signal 205 is fed to an amplifying unit 302, which is likewise contained in the reference voltage generating unit 300.

The amplifying unit 302 is formed as a transconductance amplifier, for example, which has an inverting input a and a noninverting input b through an output c. The output voltage present at the output c, that is to say the control voltage 203 with respect to the ground terminal 105, is a function of the signals present at the inputs a, b and is used for controlling the control transistor 101. In order to control the output voltage 201, the latter is divided down by means of a voltage divider unit 303, which is likewise contained in the control voltage generating unit 300, and fed to the noninverting input terminal b of the amplifying unit as a measurement voltage signal 206.

The measurement voltage signal 206 is therefore a direct measure of the output voltage 201 with respect to the ground potential 105 in such a way that a control loop is now formed. A frequency response compensation capacitor connected between the output terminal c of the amplifying unit 302 and the ground terminal 105 serves for the compensation of a frequency response of the amplifying unit 302 provided in the reference voltage generating unit 300.

The output signal of the control voltage generating unit 300, that is to say the control voltage 203 with respect to the ground terminal 305 is then not used directly for controlling the series transistor, that is to say the control transistor 101, but rather has an offset voltage 204 applied to it.

The generation of the offset voltage 204 by means of the offset voltage generating device 401 is described below. The offset voltage generating device 401 comprises a charge pump 401 and is optionally connected to the biasing capacitor 404 via a switching unit 403.

In this case, it should be pointed out that the biasing capacitor 404 is connected in series between the control terminal 104 (gate terminal G) of the control transistor 101 and the output terminal c of the amplifying unit 302 of the reference voltage generating unit 300.

A further aspect of the present application provides an offset voltage device 400, comprising the offset voltage holding device 400 and the offset voltage generating device 401. The functioning of the offset voltage device 400 is explained in more detail below. In order that the biasing capacitor 404 can maintain a bias voltage, that is to say the offset voltage 204, it is necessary to compensate for electrical charge of the biasing capacitor 404 that has flowed away as a result of leakage processes. The charge pump 401 is used for this purpose, said charge pump providing the electrical charge for charging the biasing capacitor 404. Consequently, the biasing capacitor 404 can continuously provide an offset voltage 204 as a potential difference between terminal elements 109, 110 of the biasing capacitor 404. Such an offset voltage 204 is thus superposed on the control voltage of the control transistor 101, that is to say the reference voltage 203, which is output from the reference voltage generating unit 300. The switching unit 403 of the offset voltage device 400 thus serves for switching the electrical charge provided by the charge pump 401 onto the biasing capacitor 404.

FIG. 1 shows the switch position for charging the charging capacitor L in the switching unit 403. In the other switch position, which is depicted by dashed lines in FIG. 1, the charging capacitor L is partially discharged in that it outputs charge to the biasing capacitor 404.

Figure 2:
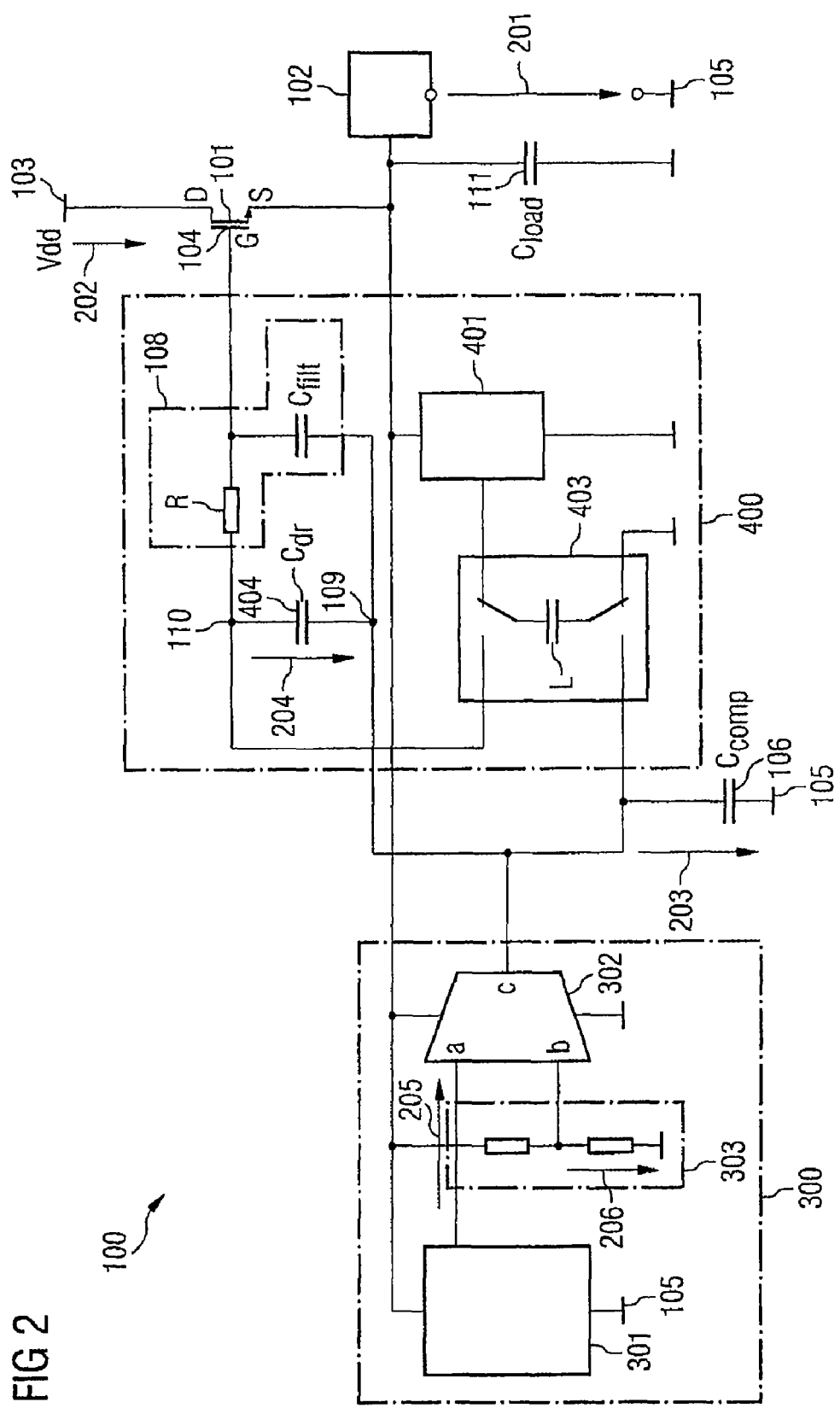
FIG. 2 shows the circuit arrangement shown in FIG. 1, wherein a filter device for filtering out switching spikes during a refresh of the biasing capacitor is additionally provided.

The circuit arrangement shown in FIG. 2 differs from the circuit arrangement shown in FIG. 1 only by virtue of the fact that a filter device 108 is furthermore connected upstream of the control terminal 104 of the control transistor 101. The filter device 108 comprises a nonreactive resistor R and a filter capacitor $C_{filt}$. Even very small switching spikes that can occur during a refresh of the capacitance of the biasing capacitor 404 can be filtered out by means of said filter capacitor. Suitable dimensioning of the refresh frequency, of the filter frequency and of the control frequency of the amplifying unit 302 of the reference voltage generating unit makes it possible for there to be no influence on the stability of the entire voltage controller 100. In order to avoid an overlap in the description, the remaining circuit components shown in FIG. 2, which have the same function as the circuit components shown in FIG. 1, are not described again with reference to FIG. 2.

Figure 3:
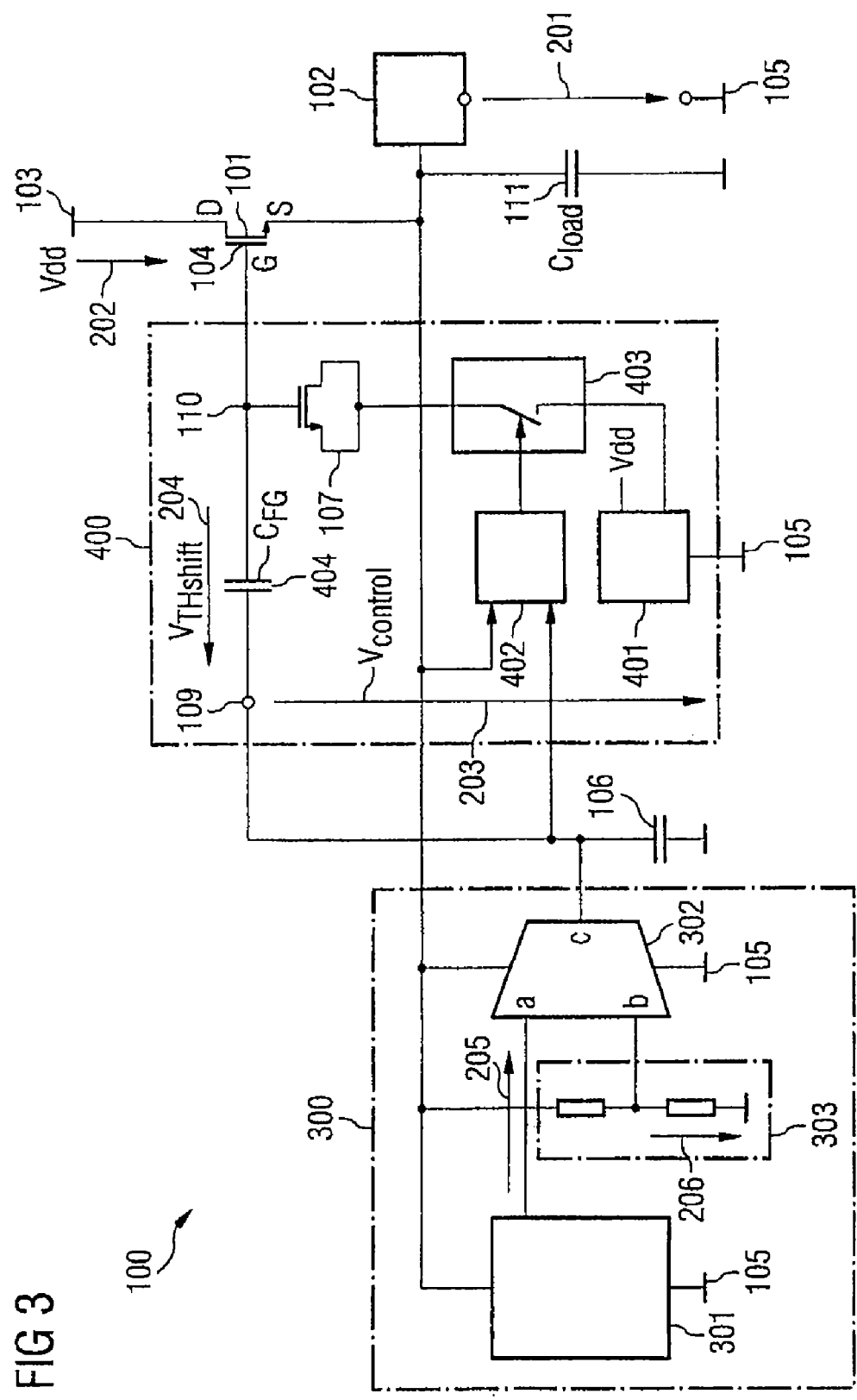
FIG. 3 shows a voltage controller in which the charge provided by means of a charge pump is transferred to the biasing capacitor via a tunnel oxide transistor, in accordance with a further preferred exemplary embodiment of the present application.

FIG. 3 shows a further exemplary embodiment in accordance with the present application, in which case, in order to avoid an overlapping description, parts or components having a function identical to those described with reference to FIGS. 1 and 2 will not be described again.

In comparison with the circuit arrangements shown in FIGS. 1 and 2, the offset voltage device 400 of the circuit arrangement in accordance with the second exemplary embodiment of the present application as shown in FIG. 3 has a tunnel oxide transistor 107, which is connected between the charge pump 401 and the control terminal 104 (gate terminal G) of the control transistor 101. Said tunnel oxide transistor 107 ensures that the gate, that is to say the control terminal 104 of the control transistor 101 becomes freely floating, that is to say that the control terminal constitutes a "floating gate". The control transistor 101 becomes a "floating gate" transistor in this way. The tunnel oxide transistor 107 provided in the offset voltage device 400 serves to ensure an electrical charge provided by the charge pump 401 onto the biasing capacitor 404 in conjunction with high isolation of the control terminal 104. The modified offset voltage device 400 shown in FIG. 3 furthermore has a switching unit 403, which connects the charge pump 401 up to the tunnel oxide transistor 107 in a manner dependent on a control signal of a discharge detection unit 402.

In the exemplary embodiment of the present application as shown in FIG. 3, unlike in the exemplary embodiments of the application as explained with reference to FIGS. 1 and 2, such switching connection is not carried out periodically by means of a refresh cycle, but rather in a manner dependent on a detected discharge state of the biasing capacitor 404 ($C_{FG}$). The discharge detection unit 402 serves for detecting a discharge state of the biasing capacitor 404, wherein the switching unit 403 is driven in accordance with the detected discharge state.

The tunnel oxide transistor 107 provides only a small tunnel gate that is added to the circuit arrangement. A decision as to when a refresh of the biasing capacitor 404 with electrical charge provided by the charge pump 401 has to be carried out is taken by means of a measurement of the total gate-source voltage $V_{GStotal}$ measured between the input terminals of the discharge detection unit 402, that is to say between the output terminal c of the amplifying unit 302 and the second terminal 102. This affords the advantage of minimizing an energy consumption by the charge pump 401.

Furthermore, it is expediently possible to start up the entire circuit arrangement rapidly, since the control transistor 101 conducts immediately at the switch-on instant. Therefore, a start-up circuit can advantageously be dispensed with. The charge pump 401 shown in the offset voltage device 400 of the exemplary embodiment shown in FIG. 3 is expediently already present in many systems which have EEPROM or flash devices. The gate oxide of the control transistor 101 expediently cannot be damaged by tunneling currents. The filter device 108 shown in FIG. 2 can be obviated since switching is not effected in normal operation, such that no interference can be coupled in either.

In one preferred development, it is also possible to perform a refresh without consulting the discharge detection unit 402, in such a way that a refresh is affected at regular time intervals on the basis of a time base. Furthermore, it is possible to carry out a refresh without any detector, just when the entire circuit arrangement, that is to say the voltage controller 100, is switched on. Furthermore, it is possible to provide a floating gate transistor having a tunnel oxide, instead of the series connection comprising a biasing capacitor 404 and the control terminal 104 as shown in FIG. 3.

A further advantage of the circuit arrangement in accordance with the second exemplary embodiment of the present application as shown in FIG. 3 is that a charge state, by means of the discharge detection unit 402, can provide additional information about a present current consumption. Furthermore, conclusions can be drawn about the operating state of the external circuit (not shown) which is supplied by means of the voltage controller 100 and which is to be connected to the second terminal 102. Such information can be used for designing the refresh cycle.

Although the present application has been described above on the basis of preferred exemplary embodiments, it is not restricted thereto, but rather can be modified in diverse ways.

Moreover, the application is not restricted to the application possibilities mentioned.

What is claimed is:

1. A voltage controller for controlling an output voltage to a predetermined value, comprising:
   a) a first terminal configured to connect a supply voltage;
   b) a second terminal configured to output the output voltage;
   c) a control voltage generating unit configured to provide a control voltage;
   d) a control transistor, which is connected as a series controller between the first terminal and the second terminal and to a control terminal to which the control voltage can be applied;
   e) an offset voltage holding device configured to hold an offset voltage, which is superposed on the control voltage; and
   f) a switching unit configured to switchably connect the offset voltage generating device to the offset voltage holding device.

2. The voltage controller as claimed in claim 1, wherein the control terminal can have a larger voltage potential with respect a ground terminal than the output voltage.

3. The voltage controller as claimed in claim 1, wherein the control voltage generating unit comprises:
   a) a reference voltage source configured to provide a reference voltage signal;
   b) a voltage divider unit configured to divide the output voltage into a measurement voltage signal; and
   c) an amplifying unit configured to compare the measurement voltage signal with the reference voltage signal and to output the control voltage in a manner dependent on the comparison.

4. The voltage controller as claimed in claim 3, wherein the amplifying unit is formed as a transconductance amplifier.

5. The voltage controller as claimed in claim 1, wherein the offset voltage holding device has a biasing capacitor configured to provide the offset voltage.

6. The voltage controller as claimed in claim 1, wherein the offset voltage generating device is a charge pump.

7. The voltage controller as claimed in claim 5, wherein the offset voltage generating device is connected to the output voltage of the voltage controller for voltage supply.

8. The voltage controller as claimed in claim 5, wherein the offset voltage generating device is configured to generate a predetermined, constant voltage.

9. The voltage controller as claimed in claim 5, further comprising a discharge detection unit configured to detect a discharge state of the biasing capacitor and to drive the switching unit in accordance with the detected discharge state.

10. The voltage controller as claimed in claim 9, wherein the discharge detection unit is configured to evaluate how far the output voltage of the control amplifier remains below the controlled output voltage.

11. A voltage controller for controlling an output voltage to a predetermined value, comprising:
   a) a first terminal configured to connect a supply voltage;
   b) a second terminal configured to output the output voltage;
   c) a control voltage generating unit configured to provide a control voltage;
   d) a control transistor, which is connected as a series controller between the first terminal and the second terminal and to a control terminal to which the control voltage can be applied; and
   e) an offset voltage holding device configured to hold an offset voltage, which is superposed on the control voltage, wherein the offset voltage holding device can switchably be connected to an offset voltage generating device, and wherein the offset voltage holding device comprises a biasing capacitor configured to provide the offset voltage and tunnel oxide transistor via which electrical charge is transferred to the biasing capacitor.

12. A voltage controller A voltage controller for controlling an output voltage to a predetermined value, comprising:
   a) a first terminal configured to connect a supply voltage;

b) a second terminal configured to output the output voltage;

c) a control voltage generating unit configured to provide a control voltage;

d) a control transistor, which is connected as a series controller between the first terminal and the second terminal and to a control terminal to which the control voltage can be applied; and e) an offset voltage holding device configured to hold an offset voltage, which is superposed on the control voltage, wherein the offset voltage holding device can switchably be connected to an offset voltage generating device, and has a filter device configured to filter out switching spikes.

13. A method for controlling an output voltage to a predetermined value, comprising:

a) providing a first terminal for connecting a supply voltage;

b) providing a second terminal for outputting the output voltage;

c) generating a control voltage by means of a control voltage unit; and d) applying the control voltage to a control terminal of a control transistor connected as a series controller between the first terminal and the second terminal, wherein an offset voltage is held by means of an offset voltage holding device, said offset voltage being superposed on the control voltage, and the offset voltage holding device being switchably connected to an offset voltage generating unit, and wherein the offset voltage superposed on the control voltage is generated by:

d1) providing a potential difference between terminal elements of a biasing capacitor;

d2) providing an electrical charge for charging the biasing capacitor by means of a charge pump; and d3) switching the electrical charge provided by the charge pump onto the biasing capacitor by means of a switching unit.

14. The method as claimed in claim 13, wherein the control terminal is connected to a larger voltage potential with respect to a ground terminal than the output voltage.

15. The method as claimed in claim 13, wherein generating the control voltage by means of the control voltage generating unit comprises:

a) providing a reference voltage signal by means of a reference voltage source;

b) dividing the output voltage into a measurement voltage signal by means of a voltage divider unit;

c) comparing a potential of the measurement voltage signal with a potential of the reference voltage signal by means of an amplifying unit; and d) outputting the control voltage from the amplifying unit in a manner dependent on the potential comparison.

16. The method as claimed in claim 15, wherein the amplifying unit is operated as a transconductance amplifier.

17. The method as claimed in claim 13, wherein generating the offset voltage further comprises:

a) detecting a discharge state of the biasing capacitor by means of a discharge detection unit; and b) driving the switching unit in accordance with the detected discharge state.

18. The method as claimed in claim 13, wherein the electrical charge provided by the charge pump is transferred to the biasing capacitor via a tunnel oxide transistor arranged in the offset voltage holding device.

19. The method as claimed in claim 13, wherein a voltage supply for the offset voltage generating device is provided by the output voltage.

* * * * *